United States Patent
Tachi et al.

(10) Patent No.: US 9,384,868 B2
(45) Date of Patent: Jul. 5, 2016

(54) WATER-BASED CONDUCTIVE INK FOR INKJET RECORDING

(75) Inventors: Mayoka Tachi, Tokyo (JP); Sunao Yoshihara, Tokyo (JP); Ryuu Koike, Tokyo (JP); Yoshinori Katayama, Tokyo (JP)

(73) Assignee: DIC CORPORATION, Tokyo (JP)

( * ) Notice: Subject to any disclaimer, the term of this patent is extended or adjusted under 35 U.S.C. 154(b) by 120 days.

(21) Appl. No.: 14/003,520

(22) PCT Filed: Mar. 5, 2012

(86) PCT No.: PCT/JP2012/055524
§ 371 (c)(1),
(2), (4) Date: Dec. 2, 2013

(87) PCT Pub. No.: WO2012/121196
PCT Pub. Date: Sep. 13, 2012

(65) Prior Publication Data
US 2014/0134327 A1    May 15, 2014

(30) Foreign Application Priority Data
Mar. 8, 2011    (JP) ................................ 2011-050126

(51) Int. Cl.
| | | |
|---|---|---|
| *H01B 1/22* | (2006.01) | |
| *B05D 5/12* | (2006.01) | |
| *C09D 11/322* | (2014.01) | |
| *C09D 11/30* | (2014.01) | |
| *H05K 3/12* | (2006.01) | |
| *C09D 11/38* | (2014.01) | |
| *C09D 11/52* | (2014.01) | |

(52) U.S. Cl.
CPC .. *H01B 1/22* (2013.01); *B05D 5/12* (2013.01); *C09D 11/30* (2013.01); *C09D 11/322* (2013.01); *C09D 11/38* (2013.01); *C09D 11/52* (2013.01); *H05K 3/125* (2013.01)

(58) Field of Classification Search
CPC ............... H01B 1/00; H01B 1/22; B05D 5/12
See application file for complete search history.

(56) References Cited

U.S. PATENT DOCUMENTS

| | | | | |
|---|---|---|---|---|
| 5,286,415 | A  * | 2/1994 | Buckley et al. | ............... 252/502 |
| 8,043,535 | B2 * | 10/2011 | Kamikoriyama et al. | .... 252/513 |
| 2008/0113195 | A1 * | 5/2008 | Boll et al. | ..................... 428/401 |
| 2008/0241414 | A1 * | 10/2008 | Kim et al. | ..................... 427/466 |
| 2009/0090272 | A1 * | 4/2009 | Toyoda et al. | ............. 106/31.92 |
| 2009/0242854 | A1 * | 10/2009 | Li et al. | ..................... 252/519.33 |
| 2009/0321689 | A1 * | 12/2009 | Harada et al. | ................. 252/513 |

FOREIGN PATENT DOCUMENTS

| | | |
|---|---|---|
| JP | 2008-184567 A | 8/2008 |
| JP | 2009-091383 A | 4/2009 |
| JP | 2010-080095 A | 4/2010 |

OTHER PUBLICATIONS

Kuraray "Isoprene glycol" product description webpage (https://web.archive.org/web/20100830222337/http://www.kuraray.co.jp/en/products/chemical/flavors02.html (Aug. 30, 2010).*
International Search Report of PCT/JP2012/055524, mailing date of Jun. 5, 2012.

* cited by examiner

*Primary Examiner* — Mark Kopec
(74) *Attorney, Agent, or Firm* — Westerman, Hattori, Daniels & Adrian, LLP

(57) ABSTRACT

There is provided a water-based conductive ink for inkjet recording, the water-based conductive ink enabling formation of highly conductive circuit wiring even by low-temperature firing. A water-based conductive ink for inkjet recording contains metal nanoparticles (X), a polyhydric alcohol (A), and water (B), wherein a polyhydric alcohol represented by the following general formula is used as the polyhydric alcohol (A)

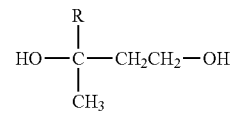

(where R represents a hydrogen atom or any one lower alkyl group selected from the group consisting of a methyl group, an ethyl group, and an n-propyl group).

9 Claims, No Drawings

WATER-BASED CONDUCTIVE INK FOR INKJET RECORDING

TECHNICAL FIELD

The present invention relates to a water-based conductive ink for inkjet recording, the water-based conductive ink enabling low-temperature firing at not more than 130° C. and enabling formation of highly conductive circuit wiring even on plastic substrates which are unsuitable for being fired at high temperature.

BACKGROUND ART

Photolithography has been widely employed to form fine electric circuits such as ICs and LSIs; for example, a photoresist layer is formed of a photoresist containing an alkali-soluble resin or another material on a conductive layer which has been formed on a circuit substrate, the product is irradiated with light through a photomask having the pattern of a conductive circuit, an electric circuit is formed, for instance, by removing part of the conductive layer corresponding to part of the resist layer other than part of the resist layer patterned with the electric circuit (removing part of the resist layer not irradiated with light and removing part of the conductive layer corresponding thereto), and the unnecessary part of the photoresist layer is optionally removed. This technique, however, includes several processes, such as irradiation with light through a photomask, and is thus complicated. Hence, such a technique has disadvantages such as the increased number of processes and high production costs.

Transistors used in ICs and LSIs have been widely employed as essential electronic devices used for producing television sets and computer equipment and, nowadays, have been produced with use of an inorganic material, such as silicon, as the main material. In recent years, attentions have been paid to organic transistors in which organic substances are used as the material of the transistors.

In such a circumstance, the field of printable electronics in which organic substance-containing inks can be used to reduce the number of processes and production costs has been attracting attention, and printing of electrical wiring by a variety of printing techniques, such as inkjet printing, screen printing, and gravure offset printing, has been studied. Among these printing techniques, inkjet printing is a printing technique which does not need use of a printing plate, therefore eliminates a process and cost for producing a printing plate, and is useful for on-demand printing; hence, the inkjet printing has been a promising technique for producing a variety of products in a small quantity.

In recent years, in view of using electronic equipment in ubiquitous environments, techniques which enable high-density packaging (formation of fine circuits) at low cost has been demanded to form circuit wiring in such electronic equipment. In a known technique among these techniques, for example, printing is carried out by an inkjet recording technique with a water-based ink containing nanometer-order metal particles as a component thereof, and then firing is carried out at not more than 180° C. to form conductive wiring (see Patent Literature 1).

In order to prepare the water-based conductive ink for inkjet recording, which has been disclosed in Patent Literature 1, glycerin is used as a polyhydric alcohol; however, conductive wiring formed with use of such an ink has an insufficient conductivity.

CITATION LIST

Patent Literature

PTL 1: Japanese Unexamined Patent Application Publication No. 2010-80095

SUMMARY OF INVENTION

Technical Problem

It is an object of the present invention to provide a water-based conductive ink for inkjet recording, the water-based conductive ink enabling formation of highly conductive circuit wiring even by low-temperature firing.

Solution to Problem

The inventors carried out intensive studies in view of the circumstance described above and found that use of a specific glycol as a polyhydric alcohol to be contained in a water-based conductive ink for inkjet recording enables formation of highly conductive circuit wiring even by firing at lower temperature without melting and swelling of, for example, plastic materials commonly used as substrates, thereby accomplishing the present invention.

An aspect of the present invention provides a water-based conductive ink for inkjet recording, the water-based conductive ink containing metal nanoparticles (X), a polyhydric alcohol (A), and water (B), wherein a polyhydric alcohol represented by the following general formula is used as the polyhydric alcohol (A).

[Chem. 1]

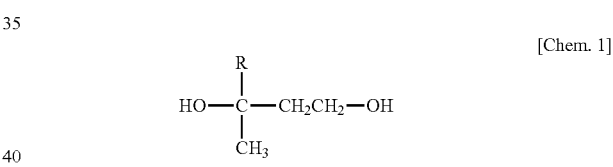

(where R represents a hydrogen atom or any one lower alkyl group selected from the group consisting of a methyl group, an ethyl group, and an n-propyl group).

The polyhydric alcohol represented by the above-mentioned general formula is hereinafter referred to as "specific polyhydric alcohol".

Advantageous Effects of Invention

According to an aspect of the present invention, the water-based conductive ink for inkjet recording involves use of the specific polyhydric alcohol having a different chemical structure from materials used in typical techniques, which can provide particularly remarkable technical effects in which circuit wiring having an excellent conductivity can be formed even by firing at low temperature.

DESCRIPTION OF EMBODIMENTS

The present invention will now be described in detail.

In the present invention, there is provided a water-based conductive ink for inkjet recording, the water-based conductive ink containing metal nanoparticles (X), a polyhydric alcohol (A), and water (B), wherein a polyhydric alcohol represented by the above-mentioned general formula is used as the polyhydric alcohol (A).

Examples of the metal nanoparticles (X) include metal nanoparticles composed of gold, silver, copper, and platinum; metal nanoparticles having an average particle size of 1 to 100 nm are preferred because they enable formation of fine patterns, a further reduction of a resistance after a firing process, and formation of circuit wiring having an excellent surface smoothness as compared with the case in which metal particles composed of the same materials and having a micrometer-order size are used. In particular, silver nanoparticles are preferably employed because the silver nanoparticles are more inexpensive, have good electrical properties and thermal properties, and exhibit excellent stability.

The "average particle size" of the metal nanoparticles (X) can be measured by dynamic light scattering in which metal particles to be analyzed are diluted in a good solvent for dispersing and expressed on a volume-averaged basis. Examples of the good solvent for dispersing silver nanoparticles include water and alcohols. In the analysis of the average particle size, for instance, Nanotrac UPA-150 manufactured by Microtrac, Inc. can be used.

The metal nanoparticles (X) may be used in their own form (solid) or may be used in the form of a water dispersion or alcohol dispersion of metal nanoparticles. In the case where the metal nanoparticles are produced in water and alcohol, the obtained water dispersion or alcohol dispersion of the metal nanoparticles can be directly used.

Examples of the water used for preparing the water dispersion include distilled water, ion exchanged water, pure water, and ultrapure water.

Examples of the alcohol used for preparing the alcohol dispersion include monoalcohols and dialcohols, such as ethanol, isopropyl alcohol, ethylene glycol. In the present invention, in order to eliminate use of glycerin in preparation of ink as well as the glycerin content in the alcohol dispersion of metal nanoparticles to be used, a glycerin-free alcohol dispersion is used.

The metal nanoparticles (X) may be dispersed alone in water or alcohol or may be used in combination with organic compounds containing basic nitrogen atoms. Combination use of these materials can enhance the dispersion stability of the metal nanoparticles (X) in the above-mentioned dispersion to aging and/or temperature change.

In particular, although the above-mentioned basic-nitrogen-atom-containing organic compound and the metal nanoparticles (X) may be separately prepared and then used in combination, the surfaces of the metal nanoparticles (X) are preferably covered with the basic-nitrogen-atom-containing organic compound for being protected. In this state, the surfaces of the metal nanoparticles (X) are not exposed, and the basic-nitrogen-atom-containing organic compound serves as an insulating layer; hence, even if a paste containing the combination of these materials is merely applied and dried at normal temperature, the formed continuous film does not have sufficient conductivity. Firing at a certain temperature, however, leads to development of excellent conductivity.

The basic-nitrogen-atom-containing organic compound to be used may be, for example, monoalkylamines having primary amino groups, such as dodecylamine, or low-molecular-weight organic compounds such as polyoxyalkyleneamine; however, in terms of securely protecting the surfaces of the metal nanoparticles (X), high-molecular-weight organic compounds (hereinafter referred to as "high molecular compounds") are preferably used.

Examples of such high molecular compounds include polyvinylpyrrolidone, polyvinylpyrrolidone-based polymers that are copolymers of vinylpyrrolidone and other monomers, polyethyleneimine, and polyethyleneimine-based polymers that are copolymers of ethyleneimine and other monomers.

Examples of the above-mentioned monomers copolymerized with vinylpyrrolidone include other ethylenically unsaturated monomers having polymerizable double bonds, such as vinyl acetate, vinyl alcohol, hydroxyalkyl(meth)acrylate, 2-dimethylaminoethyl(meth)acrylate, (meth)acrylamide, N-methylolacrylamide, N-vinylformamide, N-vinylpyridine, N-acryloylmorpholine, N-(meth)acryloyloxyethylethylene urea, N-(meth)acryloylazaethylethylene urea, polyethylene glycol mono(meth)acrylate, and ω-methoxypolyethylene glycol(meth)acrylate. Examples of the above-mentioned monomers copolymerized with ethyleneimine include other ring-opening-polymerizable monomers having a heterocycle, such as ethylene oxide, propylene oxide, butylene oxide, oxetane, and a variety of epoxy resins.

These basic-nitrogen-atom-containing high molecular compounds may be binary copolymers or ternary copolymers in terms of the number of constituent monomers, may have a linear or brunched structure in terms of the molecular structure, or may be random copolymers, block copolymers, or graft copolymers in terms of the positions of the individual monomers in the copolymers. In the case where silver nanoparticles are used in combination with such high molecular compounds, the silver ions thereof are coordinated with the nitrogen atoms of the high molecular compounds, and then the silver nanoparticles are easily reduced in the presence of a proper reductant at room temperature or under heating, which is particularly preferred.

The basic-nitrogen-atom-containing high molecular compound preferably has an average molecular weight of 10,000 to 30,000.

Examples of such a basic-nitrogen-atom-containing high molecular organic compound include polyvinylpyrrolidone K series (registered trademark) manufactured by NIPPON SHOKUBAI CO., LTD.; EPOMIN (registered trademark) series that is polyethyleneimine manufactured by NIPPON SHOKUBAI CO., LTD.; and high molecular compounds having a polyethyleneimine chain and a nonionic hydrophilic segment, such as disclosed in WO2008/143061.

The amount of the basic-nitrogen-atom-containing organic compound relative to the amount of the metal nanoparticles (X) is not specifically limited; however, the amount of the basic-nitrogen-atom-containing organic compound is normally 1 to 7 parts in order to reduce contact of the surfaces of the metal nanoparticles with humidity and oxygen and to reduce bonding of the metal nanoparticles to each other, and preferably 3 to 5 parts in view of excellent dispersion stability and ejection stability and the high conductivity of a coating film, relative to 100 parts of the metal nanoparticles (X) on a mass basis.

In the present invention, the optimum form of the metal nanoparticles (X) protected with the basic-nitrogen-atom-containing organic compound can be readily provided by adding an oxide of metal or an ionic solution of the metal to a medium in which the high molecular compound has been dispersed and reducing the oxide of the metal or ions thereof to stabilize the metal in the form of metal nanoparticles. The metal nanoparticle dispersion produced in this method exhibits excellent dispersion stability and storage properties and potentially has electric properties that reside in the metal nanoparticles.

Such a dispersion containing the metal nanoparticles (X) may be, for example, a water dispersion or an alcohol dispersion and is typically a dispersion in which metal nanoparticles have been dispersed in water or alcohol that are good solvents for dispersing the metal nanoparticles. A usable water dispersion or alcohol dispersion of metal nanoparticles contains 5 to 90% of metal nanoparticles as a nonvolatile content on a mass basis.

A variety of dispersions produced by a gas phase method such as an evaporation method or by a liquid phase method such as a liquid phase reduction method can be, without limitation, used as the dispersion of the metal nanoparticles (X) which satisfy the above-mentioned conditions such as a particle size, solid content, and dispersion medium; examples thereof include, with or without the basic-nitrogen-atom-containing organic compound content, Q1N-9P4W-NV75 (manufactured by DIC Corporation), SW1000 (manufactured by Bando Chemical Industries, Ltd.), Silquort A-1 (manufactured by Mitsubishi Materials Corporation), MDot-SLP (manufactured by Mitsuboshi Belting Ltd.), and L-Ag series (manufactured by ULVAC, Inc.).

In the case where a water dispersion containing silver nanoparticles coated with a basic-nitrogen-atom-containing high molecular organic compound is used in combination with a polyhydric alcohol represented by the specific general formula according to the present invention, further enhanced effects including dispersion stability can be expected.

The silver nanoparticles optimally used in the present invention exhibit further excellent dispersion stability and storage properties in terms of aging and with or without temperature history including an increase and decrease in temperature. Use of a binder resin that is the tertiary component other than the basic-nitrogen-atom-containing organic compound leads to a reduction in the nonvolatile content in ink as well as a reduction in the conductivity inherent in the ink; hence, the binder resin is preferably not used or used in the minimum amount.

In preparation of the water-based conductive ink for inkjet recording, water, monoalcohol, or dialcohol is used as a dispersion medium, and the metal nanoparticles as a nonvolatile content are used at a desired content; the metal nanoparticle content is normally in the range of 10 to 60%, and preferably 20 to 40%.

The water-based conductive ink for inkjet recording according to the present invention can be produced as follows: a high-concentrated dispersion having a high metal nanoparticle content is preliminarily prepared, and the metal nanoparticle content is adjusted to be suitable for ink by, for example, diluting the dispersion with a liquid medium to decrease the metal nanoparticle content. If the dispersion can be prepared at the metal nanoparticle content suitable for ink in advance, the dispersion may be directly used.

Considering that the water-based conductive ink for inkjet recording according to the present invention is used to form circuit wiring not only on substrates made of inorganic materials and organic plastic materials having a high thermal resistance and rigidity, such as glass, ceramic materials, and polyimide, but also on substrates made of thermoplastic plastic materials which have a lower thermal resistance and/or easily enable a reduction in thickness and an enhancement in flexibility, a liquid medium having the following properties is selectively used: eliminating resolution and swelling of these materials of substrates, being volatilized at lower temperature, enabling firing at lower temperature, and being less odorous and toxic to an extent that working environments are less adversely affected.

The present invention is advantageously characterized in that the above-mentioned specific polyhydric alcohol is used as a polyhydric alcohol that serves as the liquid medium.

Examples of the specific polyhydric alcohol include isoprene glycol and 1,3-butylene glycol.

Use of such a specific polyhydric alcohol can develop the excellent aging stability and ejection stability of ink itself. In addition, use of the specific polyhydric alcohol enables a further enhancement in the conductivity of a coating film in circuit wiring as compared with typical coating films having the same thickness and enables high conductivity which is less likely to be changed depending on the magnitude of the thickness of a coating film in circuit wiring within a further wide range of the thickness.

In preparation of the water-based ink of the present invention, such a specific polyhydric alcohol is used as the essential component and may be optionally used in combination with another known polyhydric alcohol. Such a polyhydric alcohol to be used in combination is preferably a polyhydric alcohol having a boiling point of not less than 100° C.

The water-based conductive ink for inkjet recording according to the present invention is different from inks used for merely forming color images in a demand characteristic that a coating film to be formed needs to have conductivity. Such a demand characteristic is a specific technical issue which is not concerned about in common water-based inks for inkjet recording.

The amount of the liquid medium contained in the water-based conductive ink for inkjet recording according to the present invention is not specifically limited; for example, the liquid medium can be used to adjust the viscosity of the ink to be from 5 to 20 (mPa·s) in view of an ejection property or another property.

The water-based conductive ink for inkjet recording according to the present invention may optionally contain known additives, such as an antifoaming agent, a surfactant, and a rheology modifier, to enhance printing properties and film properties within a dose which does not have adverse effects on the dispersion stability of the ink, wettability and leveling properties to substrates, and the properties of coating films after a firing process.

Silicone-based surfactants are especially preferably employed as a surfactant to be contained in the water-based conductive ink for inkjet recording according to the present invention, which can enhance the wettability to substrates. The amount of the silicone-based surfactant is not specifically limited and is preferably from 0.005 to 0.10 parts relative to 100 parts of ink not including the silicone-based surfactant content on a mass basis.

In preparation of the water-based conductive ink for inkjet recording according to the present invention, use of the liquid medium enables the metal nanoparticles to be applied in the form of a liquid to the above-mentioned substrates formed of a variety of materials. Since the ink of the present invention is a water-based ink, water is the essential component of the ink of the present invention, in other words, essential liquid medium. Examples of usable water are the same as described above. Liquid mediums having a larger water content are less odorous and thus easy to be handled; hence, such liquid materials are preferably employed.

The water-based conductive ink for inkjet recording, which can be produced as described above, may be optionally allowed to pass through a micropore filter or subjected to centrifugal separation or ultracentrifugal separation to remove particles which affect ejection properties and stability.

The water-based conductive ink for inkjet recording according to the present invention, which has been produced as described above, is applied by an inkjet technique onto thermoplastic plastic substrates, such as PET or PP, in the pattern of circuit wiring, the thermoplastic plastic substrates having a lower thermal resistance and lower durability to energy rays than substrates traditionally used and/or easily enabling a reduction in thickness and an enhancement in flexibility; then, firing is carried out at not more than 130° C. to form the metal nanoparticles into the pattern of circuit wiring on the substrate.

The water-based conductive ink for inkjet recording according to the present invention can be used to form a pattern corresponding to circuit wiring on a variety of substrates with a variety of inkjet recording apparatuses including a head having piezoelectric or thermal nozzles. In particular, in terms of a reduction in the occurrence of clogging in nozzle openings, the water-based conductive ink for inkjet recording is preferably applied to an inkjet printer including a head having piezoelectric nozzles.

The substrate on which the pattern corresponding to circuit wiring has been formed in this method can be fired to form conductive circuit wiring. The firing can be carried out with a variety of heat sources; far infrared ray may be employed.

Materials such as glass, ceramic materials, and polyimide have high rigidity, induce additional processes for reducing the thickness of substrates and enhancing the flexibility thereof, and are also expensive in themselves; in contrast, the above-mentioned thermoplastic plastic materials are suitable for reducing the weight and size of substrates because they are easy to be shaped, easily enable a reduction in the thickness of substrates and an enhancement in the flexibility thereof, and also are inexpensive in themselves. Hence, the water-based conductive ink for inkjet recording according to the present invention, which enables firing at a lower temperature than in typical techniques, i.e., not more than 130° C., without additional process for being irradiated with an energy ray and which enables formation of fine patterns exhibiting better surface smoothness than in typical techniques, is used to form circuit wiring on the above-mentioned thermoplastic plastic substrates which have a low thermal resistance and/or which enable a reduction in thickness and an enhancement in flexibility, thereby being able to provide electric or electronic components having a reduced weight or size.

The present invention will now be described further in detail with reference to Examples and Comparative Examples. In Examples and Comparative Examples, the terms "part" and "%" are referred to on a mass basis.

EXAMPLES

A water dispersion containing silver nanoparticles coated with a polyethyleneimine-based polymer having an average molecular weight ranging from 10,000 to 30,000 (on a nonvolatile content basis) (Q1N-9P4W-NV75 manufactured by DIC Corporation), a variety of polyhydric alcohols (special grade chemicals), ion exchanged water, and optionally KF351A manufactured by Shin-Etsu Silicone [polyoxyethylene-modified silicone-based surfactant (on a nonvolatile content basis)] were mixed and dispersed as shown in Table 1. Then, the products were filtered through a micropore filter to prepare water-based conductive inks for inkjet recording in Examples and Comparative Examples.

Each water-based conductive ink for inkjet recording was analyzed as described below immediately after the preparation thereof in terms of the appearance, viscosity, and surface tension of the ink. Tables 1 and 2 show results of the analysis.

Appearance of Ink

Whether or not sedimentation had occurred was visually confirmed. Each ink was free from sediment.

Viscosity

Viscosity was measured with an E-type viscometer at 23° C. and a rotation rate of 100 rpm. Tables 1 and 2 show results of the measurement.

Surface Tension

Surface tension was measured by the Wilhelmy method (Pt plate) at room temperature. Tables 1 and 2 show results of the measurement.

Aging Stability

The prepared water-based conductive inks for inkjet recording and the same inks stored for two weeks under cooling were analyzed in terms of the appearance, viscosity, and surface tension thereof to evaluate a difference between the inks immediately after the preparation and the stored inks. Each of the inks stored for two weeks under cooling did not have a change in its appearance as in the ink immediately after the preparation and had a good viscosity and surface tension at a rate of change of not more than 10% relative to the ink immediately after the preparation.

Each of the prepared water-based inks was ejected onto a glass substrate as a printing substrate with an inkjet printer (inkjet tester EB100 manufactured by KONICA MINOLTA, INC.) including a head having piezoelectric nozzles (evaluative printer head KM512L (ejection rate: 42 pl)) to confirm whether or not printing was able to be carried out. Printing was able to be carried out with each ink, and there was no problem with ejection properties. The printer was left to stand for five minutes without any operation, and then printing was carried out again; also in this case, printing was able to be carried out with each ink, and there was no problem with ejection properties.

Each of the prepared water-based inks was applied onto a PET film as a printing substrate by solid printing with a bar coater immediately after the preparation so as to have the dried film thicknesses shown in Table 1 (3 different thicknesses of 0.5 μm, 2.0 μm, and 3.0 μm). The films were fired at 120° C. for 30 minutes to produce evaluation samples.

The conductivity of each coating film formed on the substrate after the firing was evaluated by measuring a resistance (volume resistivity) with Loresta (manufactured by Mitsubishi Chemical Corporation) by four-point probe method.

Furthermore, a sample having a large difference in the obtained volume resistivity between the coating films having 3 different thicknesses of 0.5 μm, 2.0 μm, and 3.0 μm after the firing was determined that the volume resistivity was "dependent" on film thickness; a sample having a small difference was determined that the volume resistivity was "independent" thereof. Tables 1 and 2 show results of the analysis.

TABLE 1

|  | Example 1 | Comparative Example 1 | Comparative Example 2 |
|---|---|---|---|
| Silver nanoparticles | 30 | 30 | 30 |
| 1,3-butylene glycol | 30 | — | — |
| Glycerin | — | 30 | 10 |
| Ion exchanged water | 40 | 40 | 60 |
| Viscosity [mPas] | 7.84 | 13.0 | 2.14 |
| Surface tension [mN/m] | 46.2 | 58.0 | 58.1 |
| Volume resistivity [Ω·cm] @ 0.5 μm | $3.2 \times 10^{-6}$ | $1.0 \times 10^{-6}$ | $1.4 \times 10^{-5}$ |
| @ 2.0 μm | $6.0 \times 10^{-6}$ | $5.0 \times 10^{-1}$ | $8.2 \times 10^{-5}$ |
| @ 3.0 μm | $6.5 \times 10^{-6}$ | 1.0 | $1.4 \times 10^{-4}$ |
| Dependency of volume resistivity on film thickness | independent | dependent | dependent |

TABLE 2

|  |  | Example 2 | Example 3 | Example 4 |
|---|---|---|---|---|
| Silver nanoparticles | | 30 | 30 | 30 |
| 1,3-butylene glycol | | — | 30 | — |
| Isoprene glycol | | 30 | — | 30 |
| Ion exchanged water | | 40 | 40 | 40 |
| KF351A | | — | 0.02 | 0.02 |
| Viscosity [mPas] | | 10.30 | 7.87 | 10.39 |
| Surface tension [mN/m] | | 40.1 | 38.8 | 28.9 |
| Volume resistivity [Ω·cm] | @ 0.5 μm | $4.7 \times 10^{-6}$ | $3.0 \times 10^{-6}$ | $5.0 \times 10^{-6}$ |
|  | @ 2.0 μm | $4.4 \times 10^{-6}$ | $6.0 \times 10^{-6}$ | $4.0 \times 10^{-6}$ |
|  | @ 3.0 μm | $5.1 \times 10^{-6}$ | $7.0 \times 10^{-6}$ | $5.0 \times 10^{-6}$ |
| Dependency of volume resistivity on film thickness | | independent | independent | independent |

As is clear from the comparison of Example 1 with Comparative Examples 1 and 2, the water-based conductive ink for inkjet recording according to the present invention enabled formation of the pattern of highly conductive circuit wiring without dependency on film thickness, in which firing was able to be carried out at lower temperature and the resistance of a coating film was lower than that in typical techniques.

As is clear from the comparison of Example 1 with Example 2, use of 1,3-butylene glycol and use of isoprene glycol similarly enabled development of excellent conductivity and a reduction in the dependency on film thickness. As is clear from the comparison of Example 1 with Example 3, use of the silicone-based surfactant in combination enabled a reduction in surface tension as compared with a case in which the silicone-based surfactant had not been used, leading to an enhancement in wettability to substrates.

INDUSTRIAL APPLICABILITY

The water-based conductive ink for inkjet recording according to the present invention is prepared with use of a polyhydric alcohol that is the specific polyhydric alcohol and therefore enables highly conductive circuit wiring having a lower resistance to be formed in any film thickness even on common plastic substrates having a low thermal resistance by firing at lower temperature.

The invention claimed is:

1. A water-based conductive ink for inkjet recording, the water-based conductive ink comprising:
   metal nanoparticles (X);
   a polyhydric alcohol (A) represented by the general formula below;
   water (B); and
   a high molecular organic compound containing a basic nitrogen atom

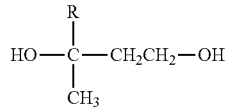

where R represents a hydrogen atom or any one lower alkyl group selected from the group consisting of a methyl group, an ethyl group, and an n-propyl group,
   wherein the water-based conductive ink is capable of being cured by firing at a temperature not more than 130° C.

2. The water-based conductive ink for inkjet recording according to claim 1, wherein the high molecular organic compound containing a basic nitrogen atom has an average molecular weight of 10,000 to 30,000.

3. The water-based conductive ink for inkjet recording according to claim 1, wherein the amount of the high molecular organic compound containing a basic nitrogen atom is from 1 to 7 parts relative to 100 parts of the metal nanoparticles (X) on a mass basis.

4. The water-based conductive ink for inkjet recording according to claim 1, further comprising a silicone-based surfactant.

5. The water-based conductive ink for inkjet recording according to claim 1, wherein the polyhydric alcohol (A) is 1,3-butylene glycol.

6. The water-based conductive ink for inkjet recording according to claim 1, wherein the polyhydric alcohol (A) is isoprene glycol.

7. The water-based conductive ink for inkjet recording according to claim 1, wherein the water-based conductive ink is capable of being cured by firing at a temperature not more than 130° C. to exhibit required conductivity for a circuit board.

8. A method for producing an electric component and an electronic component, the method comprising forming a pattern corresponding to circuit wiring on a thermoplastic plastic substrate with use of the water-based conductive ink for inkjet recording according to claim 1 and firing the pattern at not more than 130° C.

9. The method according to claim 8, wherein the thermoplastic plastic substrate is a PET film.

* * * * *